United States Patent [19]
Yamauchi

[11] Patent Number: 5,663,912
[45] Date of Patent: Sep. 2, 1997

[54] SEMICONDUCTOR MEMORY DEVICE

[75] Inventor: Tadaaki Yamauchi, Hyogo, Japan

[73] Assignee: Mitsubishi Denki Kabushiki Kaisha, Tokyo, Japan

[21] Appl. No.: 607,045

[22] Filed: Feb. 26, 1996

[30] Foreign Application Priority Data

Sep. 1, 1995 [JP] Japan .................. 7-225172

[51] Int. Cl.$^6$ .................................................. G11C 7/00
[52] U.S. Cl. .................. 365/194; 365/233.5; 365/189.05
[58] Field of Search ............................ 365/194, 233, 365/233.5, 230.03, 189.01, 189.05

[56] References Cited

U.S. PATENT DOCUMENTS

| | | | |
|---|---|---|---|
| 4,649,522 | 3/1987 | Kirsch | 365/189.05 |
| 4,797,573 | 1/1989 | Ishimoto | 365/194 |
| 4,858,197 | 8/1989 | Aono et al. | 365/233.5 |
| 5,361,230 | 11/1994 | Ikeda et al. | 365/194 |
| 5,384,735 | 1/1995 | Park et al. | 365/194 |
| 5,414,672 | 5/1995 | Ozeki et al. | 365/233.5 |
| 5,436,865 | 7/1995 | Kitazawa | 365/294 |
| 5,553,024 | 9/1996 | Furuyama | 365/189.05 |

FOREIGN PATENT DOCUMENTS

4-79080  12/1992  Japan .

*Primary Examiner*—Tan T. Nguyen
*Attorney, Agent, or Firm*—Lowe, Price, LeBlanc & Becker

[57] ABSTRACT

A DRAM is disclosed in which column address COL1 is taken in when signal /CAS falls at time t1, data D1 is output after period $t_{CD}$ has elapsed from the rise of signal /CAS at time t2, and output of data D1 is stopped after period $t_{CDH}$ has elapsed from the fall of signal /CAS at time t3. Therefore, upon interleave operations, data collision does not occur at the rise and fall of signal /CAS.

6 Claims, 9 Drawing Sheets

SEMICONDUCTOR MEMORY DEVICE

BACKGROUND OF THE INVENTION

1. Field of the Invention

The present invention relates to semiconductor memory devices, and more particularly, to a semiconductor memory device for reading out data in response to a control clock signal and an address signal applied externally.

2. Description of the Background Art

Figure 8:
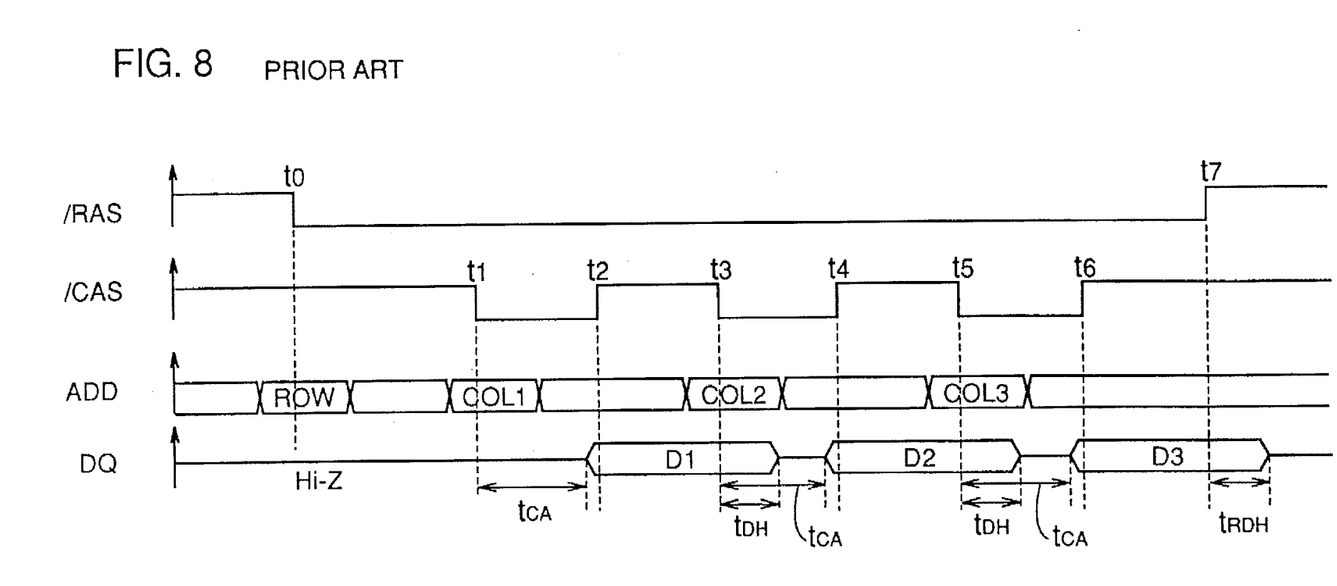
FIG. 8 is a timing chart illustrating consecutive readout operations of a conventional DRAM.

FIG. 8 is a timing chart illustrating consecutive readout operations of a conventional dynamic random access memory (hereinafter referred to as a DRAM). Such a DRAM is disclosed in, for example, U.S. Pat. No. 4,649,522.

Referring to FIG. 8, a row address ROW is taken in when a signal /RAS falls at time t0, and a first column address COL1 is taken in when a signal /CAS (control clock signal) falls at time t1. After a column access time period $t_{CA}$ has passed from time t1, data D1 at an address specified by row address ROW and column address COL1 is output. Output of data D1 continues even after the subsequent rise of signal /CAS at time t2 and is stopped after a data hold time period $t_{DH}$ has passed from the fall of signal /CAS at time t3. Here, the relationship $t_{DH} < t_{CA}$ holds true.

A second column address COL2 is taken in when signal /CAS falls at time t3, and data D2 addressed by row address ROW and column address COL2 is output after column access time period $t_{CA}$ has passed from time t3.

Thus, in such a DRAM, output of data continues for an "H" (High) level period of signal /CAS in addition to an "L" (Low) level period thereof in order to achieve a high-speed column access.

The DRAM described above, however, gives rise to the following problem. Let us consider an example in which a computer with two banks A and B is constructed by using two of such DRAMs to perform interleave operations. Here, it is assumed that interleave operations are the operations in which two banks A and B are alternately accessed so that column access time period $t_{CA}$ appears to be non-existent.

Figure 9:
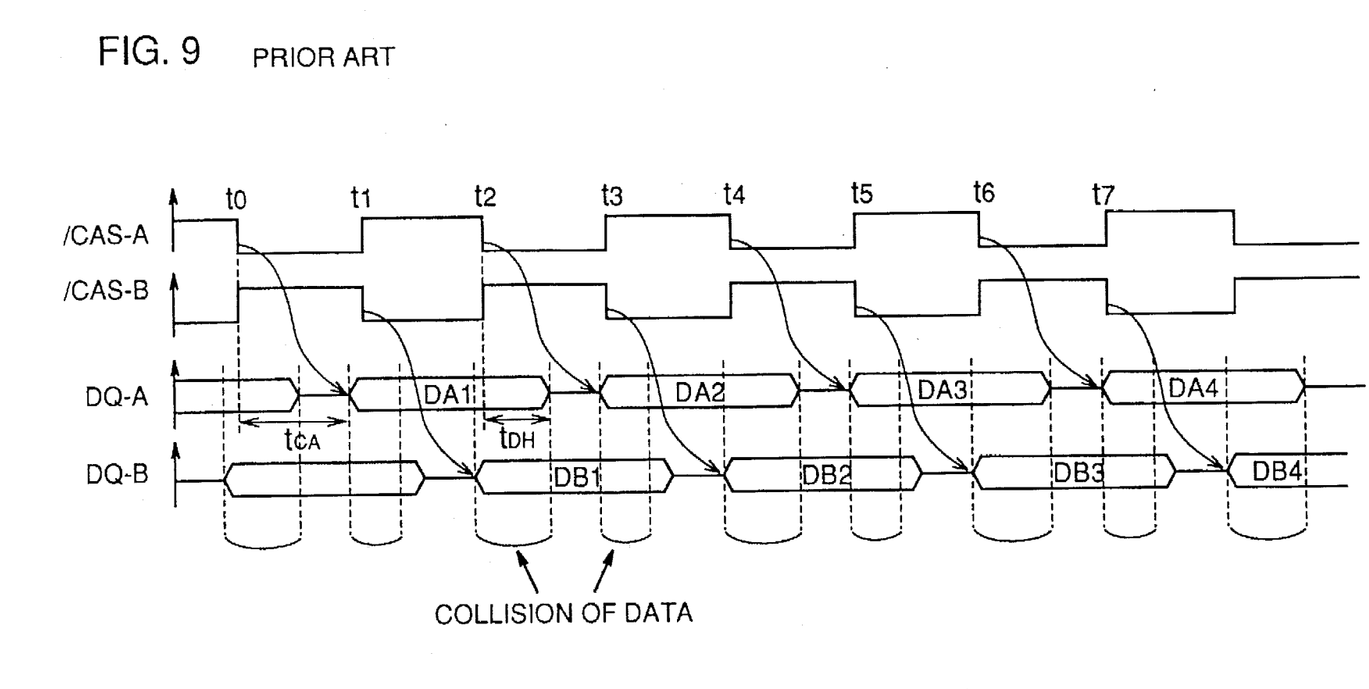
FIG. 9 is a timing chart illustrating interleave operations of a computer including the DRAM shown in FIG. 8.

FIG. 9 is a timing chart illustrating the interleave operations of such a computer. Here, signals /CAS-A and /CAS-B are the signals /CAS for banks A and B, respectively, and data DQ-A and DQ-B are the data DQ for banks A and B, respectively.

Referring to FIG. 9, data DA1 corresponding to a fall of signal /CAS-A at time t0 is output after column access time period $t_{CA}$ has elapsed from time t0. Data DB1 corresponding to a fall of signal /CAS-B at time t1 is output after column access time period $t_{CA}$ has elapsed from time t1. When signal /CAS-A falls again at time t2, output of data DA1 in bank A is stopped after data hold time period $t_{DH}$ has elapsed from time t2, and the next data DA2 in bank A is output after column access time period $t_{CA}$ has elapsed from time t2.

During data hold time period $t_{DH}$ starting from time t2, data is output from both of the two banks A and B, whereby collision of data occurs. As a result, data cannot be taken in correctly at the falling edge or the rising edge of signal /CAS.

SUMMARY OF THE INVENTION

An object of the present invention is to provide a semiconductor memory device which prevents collision of data at rise and fall of a control clock signal during interleave operations on control clock signal.

A semiconductor memory device according to a first aspect of the present invention reads out data in response to a control clock signal and an address signal applied externally, and includes a memory circuit, a readout circuit, and an output circuit. The memory circuit includes a plurality of addresses and data is stored at each address. The readout circuit takes in the address signal in response to a change of the control clock signal from a first potential and second potential, and reads out data at an address specified by the address signal from the memory circuit. The output circuit outputs readout data of the readout circuit to outside after a first time period has elapsed since the control clock signal changes from the second potential to the first potential, and stops output of the readout data to outside after a second time period has elapsed since the control clock signal changes from the first potential to the second potential.

Therefore, according to the present invention, data is read out from the memory circuit when the control clock signal falls, data is output after the first time period has elapsed from the subsequent rise of the control clock signal, and output of data is stopped after the second time period has elapsed from the next fall of the control clock signal. As a result, if interleave operations are performed on the control clock signal, data from the two memory circuits will not collide with each other at a rise and a fall of the control clock signal.

Preferably, the second time period is equal to the first time period, and the output circuit includes a delay circuit and an output buffer. The delay circuit delays the control clock signal for the first time period. The output buffer outputs readout data of the readout circuit to outside in response to a change of an output signal of the delay circuit from the second potential to the first potential, and stops output of the readout data to outside in response to a change of the output signal of the delay circuit from the first potential to the second potential. Thus, the output circuit can be constructed easily.

Alternatively and preferably, the second time period is shorter than the first time period, and the output circuit includes first and second delay circuits, a logic circuit and an output buffer. The first delay circuit delays the control clock signal for the first time period. The second delay circuit delays the control clock signal for the second time period. The logic circuit outputs the first potential in response to output signals of the first and second delay circuits being the first potential. The output buffer outputs readout data of the readout circuit to outside in response to a change in an output signal of the logic circuit from the second potential to the first potential, and stops output of the readout data to outside in response to a change in the output signal of the logic circuit from the first potential to the second potential. Thus, the output circuit can be constructed easily. Data from the two memory circuits will not collide with each other not only at a rise and a fall of the control clock signal but for the entire time period.

A semiconductor memory device according to a second aspect of the present invention reads out data in response to first and second control clock signals complementary to each other and an address signal which are applied externally, and includes first and second memory circuits, first and second readout circuits, and first and second output circuits. Each of the first and second memory circuits includes a plurality of addresses, and data is stored at each address. The first readout circuit takes in the address signal in response to a change in the first control clock signal from a first potential to a second potential, and reads out data at an address specified by the address signal from the first memory circuit. The second readout circuit takes in the address signal in response to a change in the second control clock signal from the first potential to the second potential, and reads out data at an address specified by the address signal from the second memory circuit. The first output circuit outputs readout data of the first readout circuit to outside after a first time period has elapsed since the first control clock signal changes from the second potential to the first potential, and stops output of the readout data in the first readout circuit to outside after a second time period has elapsed since the first control clock signal changes from the first potential to the second potential. The second output circuit outputs readout data of the second readout circuit to outside after the first time period has elapsed since the second control clock signal changes from the second potential to the first potential, and stops output of the readout data in the second readout circuit to outside after the second time period has elapsed since the second control clock signal changes from the first potential to the second potential.

Therefore, according to the present invention, pieces of data are read out from the first and second memory circuits when the first and second control clock signal fall respectively, pieces of data in the first and second memory circuits are output after the first time period has elapsed since the next falls of the first and second control clock signals respectively, and output of data in the first and second memory circuits is stopped after the second time period has elapsed from the next falls of the first and second control clock signals respectively. Consequently, the pieces of data from the first and second memory circuits will not collide with each other when the first and second control clock signals rise and fall upon interleave operations.

Preferably, the second time period is equal to the first time period, the first output circuit includes a first delay circuit and a first output buffer, the second output circuit includes a second delay circuit and a second output buffer. The first delay circuit delays the first control clock signal for the first time period. The first output buffer outputs readout data in the first readout circuit to outside in response to a change in an output signal of the first delay circuit from a second potential to a first potential, and stops output of the readout data in the first readout circuit to outside in response to a change in the output signal of the first delay circuit from the first potential to the second potential. The second delay circuit delays the second control clock signal for the first time period. The second output buffer outputs readout data in the second readout circuit in response to a change in an output signal of the second delay circuit from the second potential to the first potential, and stops output of the readout data in the second readout circuit to outside in response to a change in the output signal of the second delay circuit from the first potential to the second potential. Thus, the first and second output circuits can be constructed easily.

Alternatively and preferably, the second time period is shorter than the first time period, and the first output circuit includes first and second delay circuits, a first logic circuit, and a first output buffer, and the second output circuit includes third and fourth delay circuits, a second logic circuit, and a second output buffer. The fourth delay circuit delays the first control clock signal for the first time period. The second delay circuit delays the first control clock signal for the second time period. The first logic circuit outputs the first potential in response to output signals of the first and second delay circuits being the first potential. The first output buffer outputs readout data in the first readout circuit to outside in response to a change in the output signal of the first logic circuit from the second potential to the first potential, and stops output of the readout data in the first readout circuit to outside in response to a change in the output signal of the first logic circuit from the first potential to the second potential. The third delay circuit delays the second control clock signal for the first time period. The fourth delay circuit delays the second control clock signal for the second time period. The second logic circuit outputs the first potential in response to output signals of the third and fourth delay circuits being the first potential. The second output buffer outputs readout data in the second readout circuit to outside in response to a change in the output signal of the second logic circuit from the second potential to the first potential, and stops output of readout data in the second readout circuit to outside in response to a change in the output signal of the second logic circuit from the first potential to the second potential. Thus, the first and second output circuits can be constructed easily. Furthermore, pieces of data from the first and second memory circuits will not collide with each other not only at a rise and a fall of the first and second control clock signals but for the entire time period.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
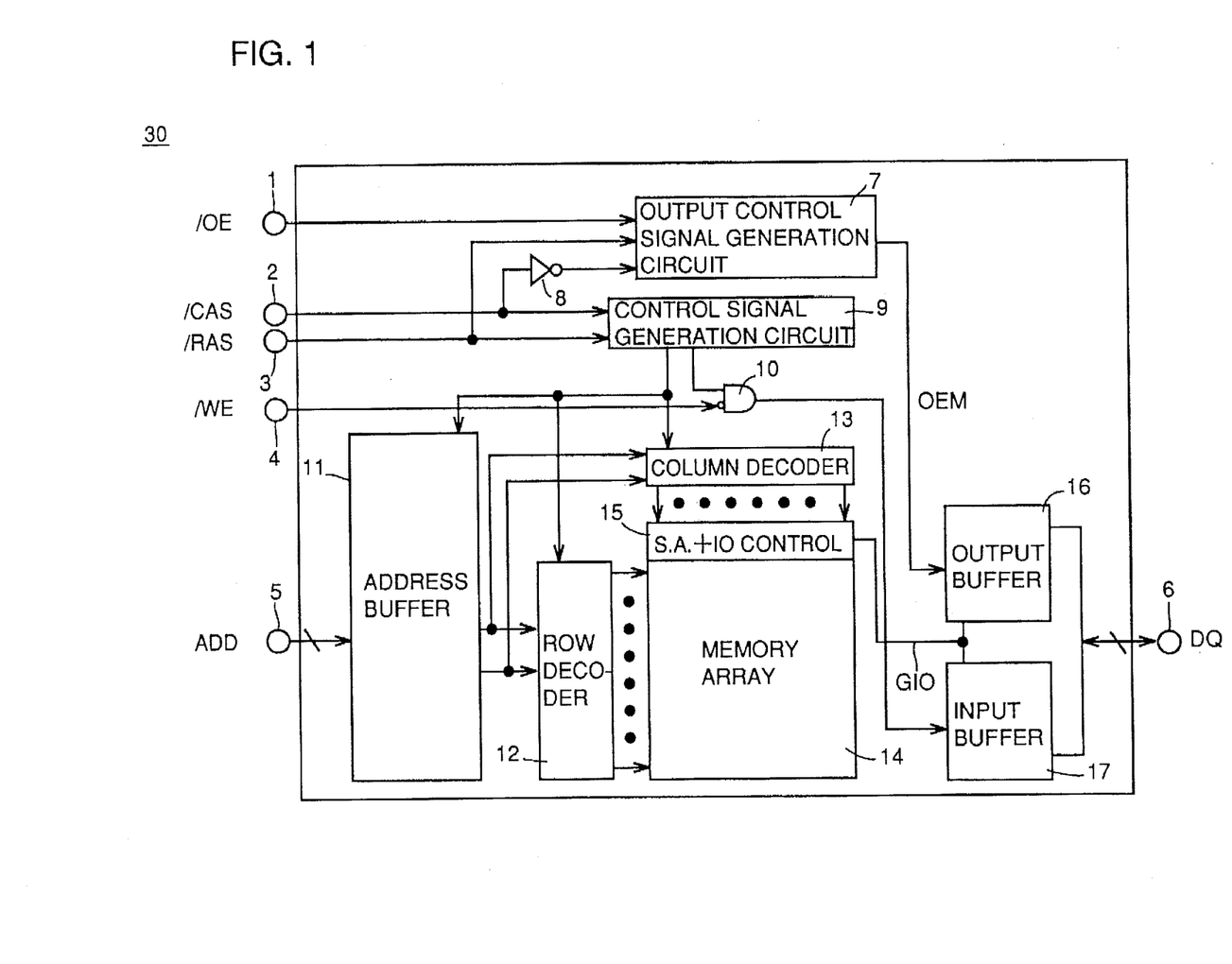
FIG. 1 is a circuit block diagram showing a structure of a DRAM in accordance with a first embodiment of the present invention.

FIG. 1 is a block diagram showing a structure of a DRAM 30 in accordance with a first embodiment of the present invention.

Referring to FIG. 1, DRAM 30 includes control signal input terminals 1–4, an address signal terminal group 5, and a data signal input/output terminal group 6. Control signal input terminals 1–4 receive externally applied control signals /OE, /CAS, /RAS, /WE, respectively. Address signal input terminal group 5 receives an externally applied address signal ADD. Data signal input/output terminal group 6 is provided for input/output of data DQ between the inside and the outside of DRAM 30.

DRAM 30 further includes an output control signal generation circuit 7, an inverter 8, a circuit 9 for generating a control signal, a gate circuit 10, an address buffer 11, a row decoder 12, a column decoder 13, a memory array 14, a sense refresh amplifier and IO control circuit 15, an output buffer 16, and an input buffer 17.

Figure 2:
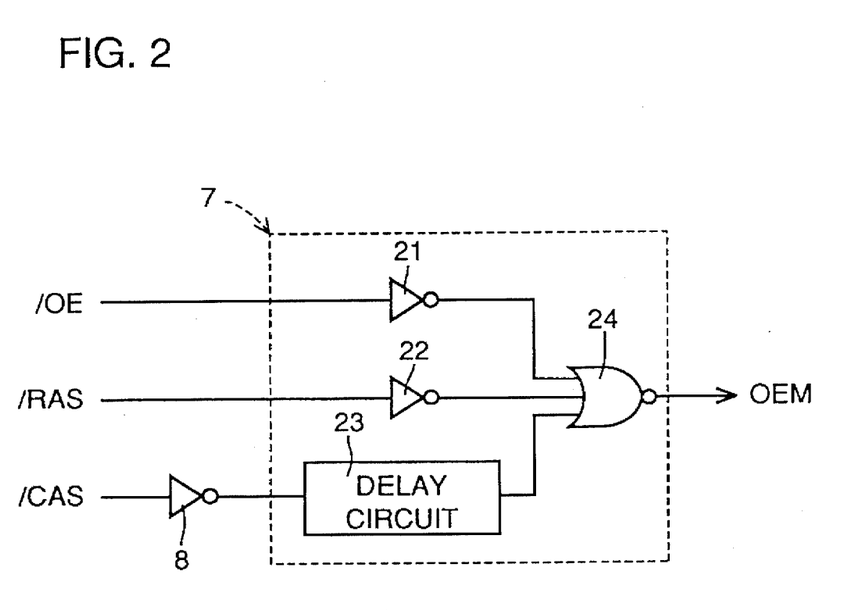
FIG. 2 is a circuit block diagram showing a structure of an output control signal generation circuit in the DRAM shown in FIG. 1.

Output control signal generation circuit 7 includes inverters 21 and 22, a delay circuit 23, and an NOR gate 24, as shown in FIG. 2. Inverters 21 and 22 receive signals /OE and /RAS, respectively. Delay circuit 23 receives signal /CAS through inverter 8. NOR gate 24 receives outputs from inverters 21 and 22 and delay circuit 23, and applies an output control signal OEM to output buffer 16. After a delay time period of delay circuit 23 has elapsed since signal /CAS attains an "L" level which is an activation level and signals /OE and /RAS attain an "L" level which is an activation level, signal /OEM attains an "H" level which is an activation level, thereby activating output buffer 16.

Control signal generation circuit 9 selects a predetermined operation mode in accordance with signals /RAS and /CAS and controls the entire DRAM 30. Gate circuit 10 activates input buffer 17 in response to selection of a write operation mode by control signal generation circuit 9 and signal /WE attaining an "L" level, an activation level.

Address buffer 11 selectively applies address signal ADD, externally applied through address signal input terminal group 5, to row decoder 12 and column decoder 13 upon readout and write operations. Memory array 14 includes a plurality of memory cells, each storing 1 bit of data. Each memory cell is arranged at a prescribed address determined by row and column addresses. Row decoder 12 is responsive to the address signal applied from address buffer 11 and specifies a row address of memory array 14. Column decoder 13 is responsive to the address signal applied from address buffer 11 and specifies a column address of memory array 14.

Upon readout and write operations, sense refresh amplifier+IO control circuit 15 connects the memory cell at the address specified by row and column decoders 12 and 13 to one end of a global signal input/output line pair GIO. During refresh operations, circuit 15 also refreshes data in the memory cell having the row address specified by row decoder 12.

The other end of global signal input/output line pair GIO is connected to output buffer 16 and input buffer 17. Upon readout operations, output buffer 16 is responsive to signal OEM applied from generation circuit 7 and outputs readout data from the selected memory cell to data signal input/output terminal group 6. Upon write operations, input buffer 17 responds to an output of gate circuit 10 to apply data from group 6 to the selected memory cell through global signal input/output line pair GIO.

Figure 3:
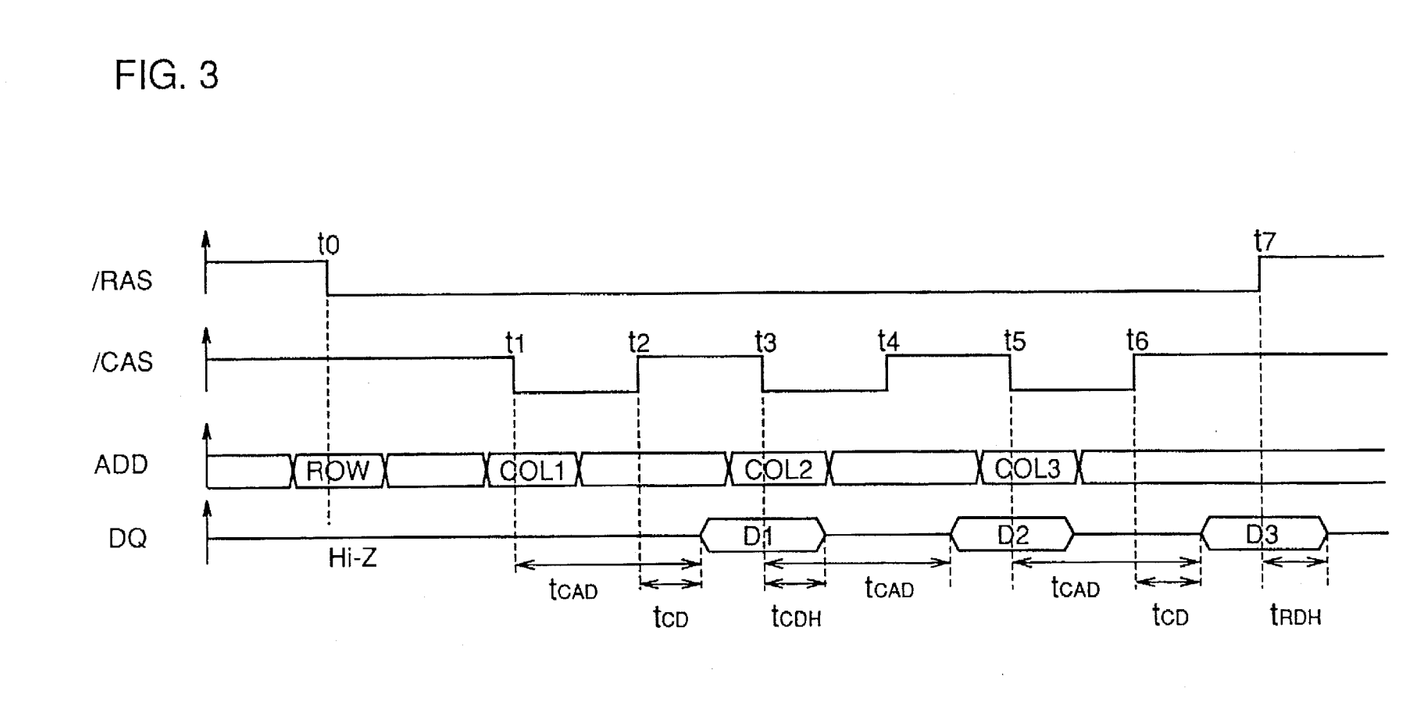
FIG. 3 is a timing chart illustrating consecutive readout operations of the DRAM shown in FIG. 1.

FIG. 3 is a timing chart illustrating consecutive readout operations of DRAM 30 shown in FIGS. 1 and 2. Referring to FIG. 3, signal /RAS falls at time t0, and row address ROW is taken in response thereto, thereby initiating row system operations. When signal /CAS falls at time t1, column address COL1 is taken in, thereby initiating column system operations. After signal /CAS rises at time t2, readout data D1 is output to data signal input/output terminal group 6. It should be noted that data D1 is output after period $t_{CAD}$ has elapsed from the fall of signal /CAS at time t1 and period $t_{CD}$ has elapsed from the rise of signal /CAS at time t2.

When signal /CAS falls at time t3, column address COL2 is taken in, and column access is initiated to column address COL2. Output of data D1 is stopped after period $t_{CDH}$ has elapsed from time t3, whereby group 6 attains a high impedance state. Thereafter, output of data D2 corresponding to column address COL2 is initiated after period $t_{CAD}$ has elapsed from time t3. Data D3 corresponding to column address COL3 is output similarly to data D1 and D2. Output of data D3 is stopped after period $t_{RDH}$ has elapsed from the rise of signal /RAS at time t7, whereby group 6 attains a high impedance state.

Here, $t_{CCDH}$ represents a data hold time period from the fall of signal /CAS to the stop of data output, and $t_{RDH}$ represents a hold time period from the rise of signal /RAS to the stop of data output. Period $t_{CAD}$ is longer than column access time period $t_{CA}$, and periods $t_{CAD}$ and $t_{CDH}$ are shorter than periods $t_{CAD}$ and $t_{CAD}$. It should be noted that time periods $t_{CD}$ and $t_{CDH}$ are set to be equal, since delay circuit 23 delays the rise and fall of the /CAS signal by an equal amount.

Thus, generation circuit 7 is constructed to generate signal OEM so that column access is initiated when signal /CAS falls, the accessed data is output after period $t_{CD}$ has elapsed from the subsequent rise of signal /CAS, and output of data is stopped after period $t_{CDH}$ has elapsed from the next fall of signal /CAS.

In contrast to the conventional DRAM shown in FIG. 8, data is output after signal /CAS rises, whereby the access time from the fall of signal /CAS to data output becomes longer than conventional access time if cycle time of signal /CAS is long. However, if the cycle time of signal /CAS is reduced, $t_{CAD}$ can also be reduced to column access time $t_{CA}$, thereby achieving the same access time as the conventional device. More specifically, since access to the column is performed in the DRAM while signal /CAS is at an "L" level at which data is not output, no time will be lost, and access time and minimum cycle time of signal /CAS are substantially the same as those of the conventional DRAM in FIG. 8.

Figure 4:
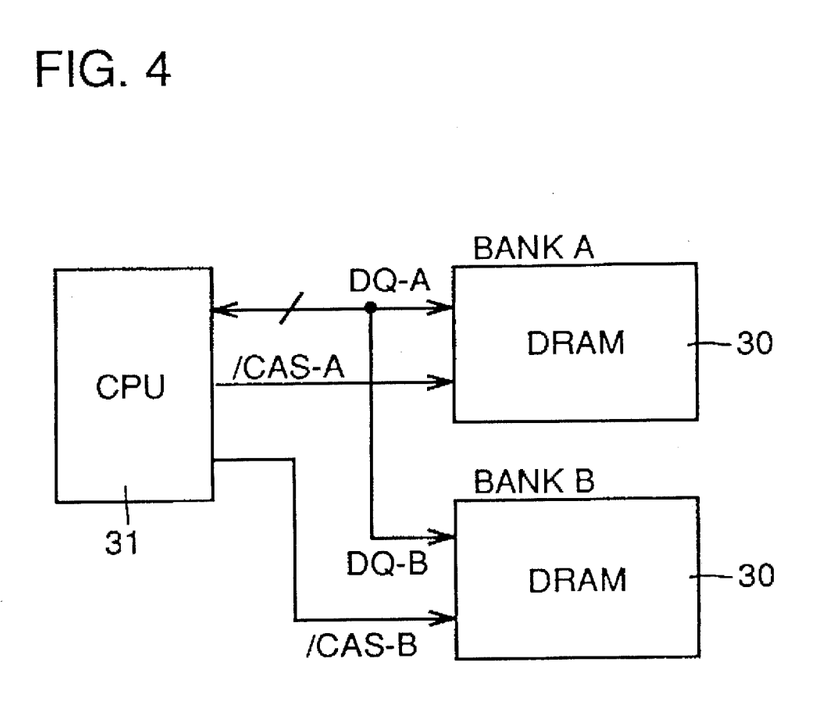
FIG. 4 is a block diagram showing a structure of a computer including the DRAM shown in FIG. 1.

FIG. 4 is a block diagram showing a structure of a computer including two DRAMs 30 shown in FIGS. 1–3. Referring to FIG. 4, the computer includes banks A and B each formed of DRAM 30, and a central processing unit (hereinafter referred to as a CPU) 31. CPU 31 applies signals /CAS-A and /CAS-B to banks A and B, respectively, and receives data DQ-A and DQ-B from banks A and B. Signals /CAS-A and /CAS-B are clock signals complementary to each other.

Figure 5:
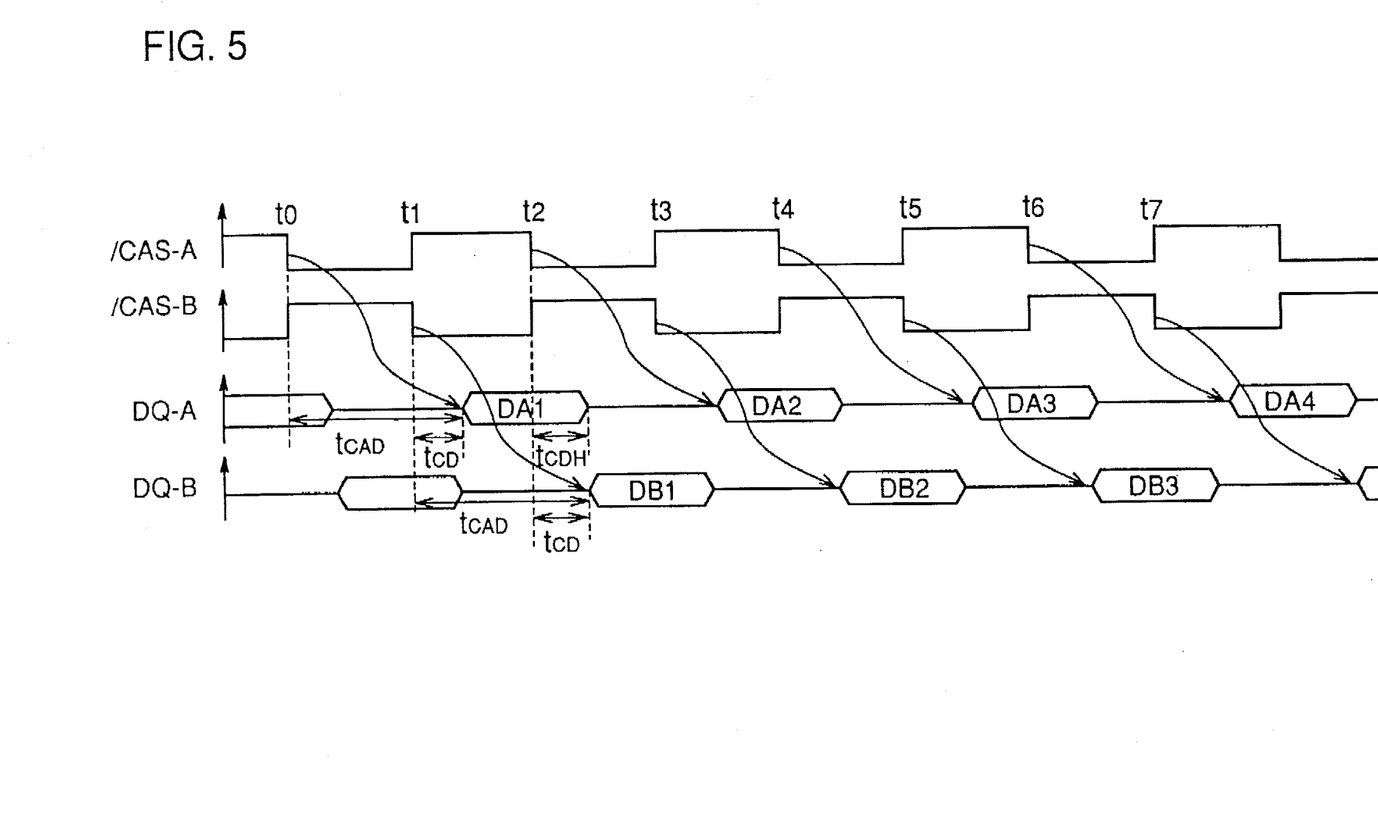
FIG. 5 is a timing chart illustrating interleave operations of the computer shown in FIG. 4.

FIG. 5 is a timing chart illustrating interleave operations of the computer shown in FIG. 4. Data DA1 is corresponding to the fall of signal /CAS-A at time t0 is output from bank A to CPU 31 after period $t_{CD}$ has elapsed from the rise of signal /CAS-A at time t1 and period $t_{CAD}$ has elapsed from time t0. Meanwhile, data DB1 corresponding to the fall of signal /CAS-B at time t1 is output from bank B to CPU 31 after period $t_{CD}$ has elapsed from the rise of signal /CAS-B at time t2 and period $t_{CAD}$ has elapsed from time t1. Output of data DA1 from bank A is stopped after data hold time period $t_{CDH}$ has elapsed from the rise of signal /CAS-A at time t2, whereby data signal input/output terminal group 6 of bank A attains a high impedance state. Next data DA2 is output from bank A to CPU 31 after period $t_{CAD}$ has elapsed from time t2.

Thus, in the computer including DRAM 30 in accordance with the present embodiment, data is output from only one of banks A and B at a time close to the rising or falling edge of signals /CAS-A and /CAS-B, so that data will not be collided. Therefore, CPU 31 can accurately receive output data from banks A and B at the falling or rising edge of signals /CAS-A and /CAS-B.

Second Embodiment

Figure 6:
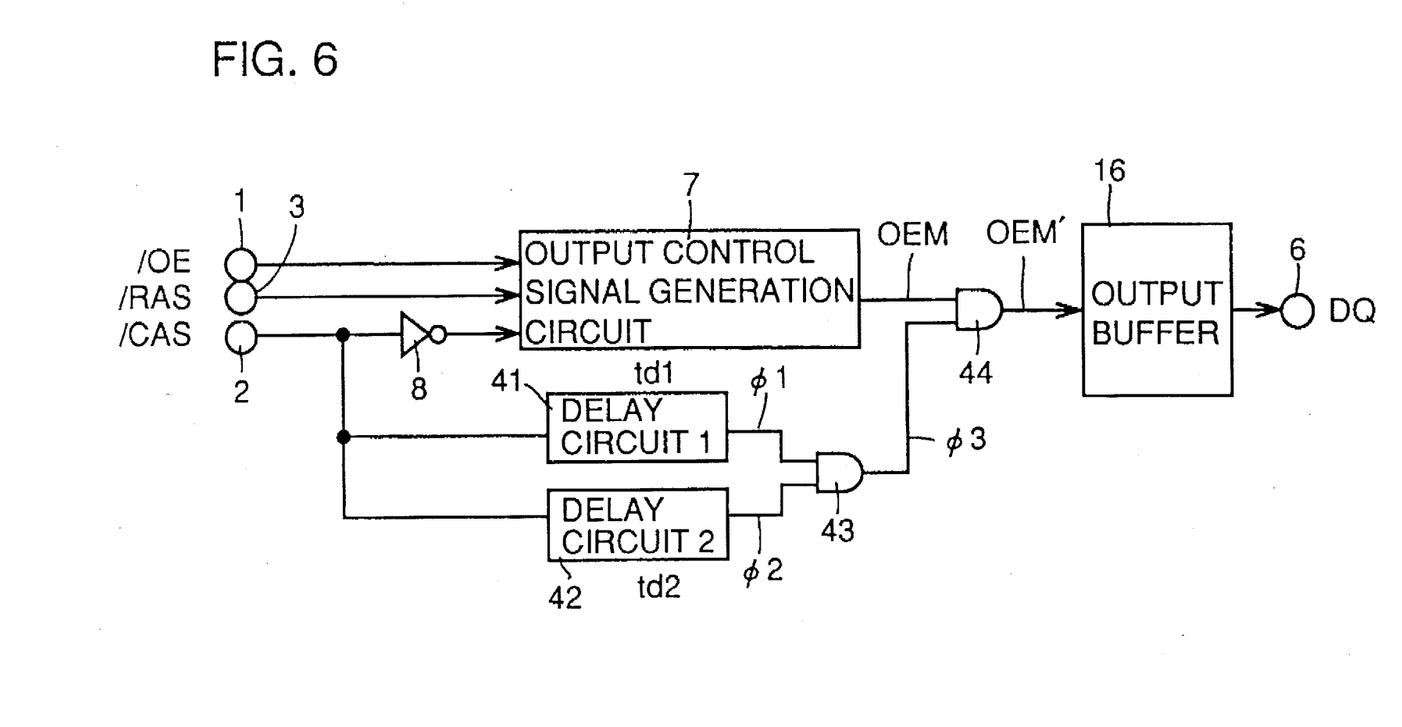
FIG. 6 is a circuit block diagram showing a structure of an important part of a DRAM in accordance with a second embodiment of the present invention.

FIG. 6 is a circuit block diagram showing a structure of an important part of a DRAM in accordance with a second embodiment of the present invention.

Referring to FIG. 6, this DRAM is different from DRAM 30 in the first embodiment in that delay circuits 41 and 42 and AND gates 43 and 44 are provided additionally. Delay circuits 41 and 42 receive signals /CAS. AND gate 44 receives an output $\phi 1$ of delay circuit 41 and an output $\phi 2$ of delay circuit 42. AND gate 44 receives output OEM of output control signal generation circuit 7 and an output $\phi 3$ of AND gate 43, and applies a signal OEM' to output buffer 16. When signal OEM' attains an "H" level which is an activation level, output buffer 16 is activated, thereby outputting data DQ.

Here, a delay time period td1 of delay circuit 41 is set longer than a delay time period td2 of delay circuit 42. Delay time period td2 of delay circuit 42 is set shorter than the time period from the time when signal /CAS falls to an "L" level to the time when output OEM of circuit 7 attains an "L" level.

Figure 7:
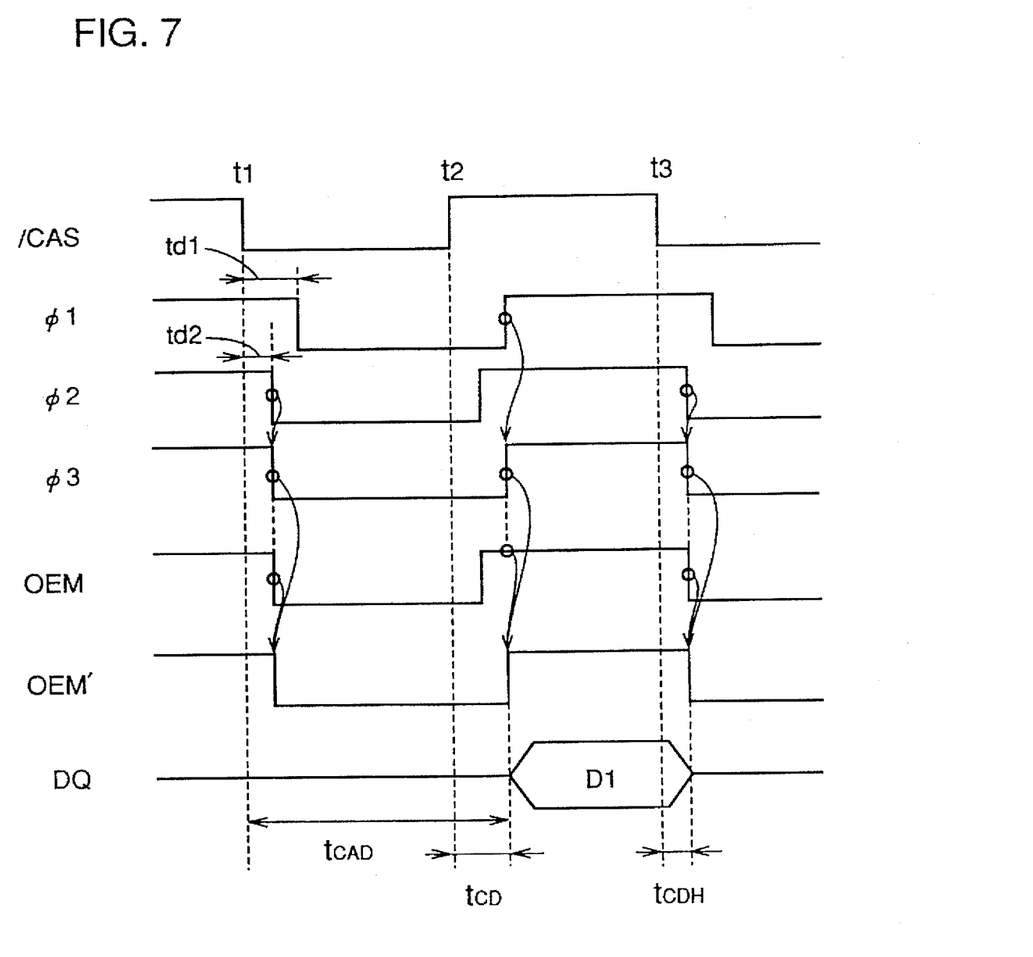
FIG. 7 is a timing chart illustrating operations of the DRAM shown in FIG. 6.

FIG. 7 is a timing chart illustrating readout operations of the DRAM shown in FIG. 6. Signal OEM' attains an "H" level and output of data D1 is initiated when time period $t_{CD}$ has elapsed from time t2, which time period $t_{CD}$ is defined as a longer one of the period from time t2 when signal /CAS rises to the time when output OEM of circuit 7 attains an "H" level and period td1 from time t2 when signal /CAS rises to the time when output $\phi 1$ of delay circuit 41 attains an "H" level (in the figure, $t_{CD}$=td1). After delay time period td2 of delay circuit 42 has elapsed from the fall of signal /CAS at time t3, signal OEM' attains an "L" level, thereby stopping output of data D1. Therefore, time period $t_{CD}$ from the rise of signal /CAS to the time of output of data D1 is longer than time period $t_{CDH}$ from the fall of signal /CAS to the time when output of data D1 is stopped.

In accordance with the present embodiment, since period $t_{CD}$ is longer than period $t_{CDH}$, data of bank A and data of bank B will not collide not only near the rising or falling edge of signal /CAS but also for the rest of the period, when interleave operations are performed on signal /CAS as shown in FIG. 5. Consequently, output data of banks A and B can be taken in at any timing, not only near the falling or rising edge of signal /CAS.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for reading out data in response to a control clock signal and an address signal applied externally, comprising:

memory means including a plurality of addresses, data being stored at each of said addresses;

readout means for taking in said address signal in response to a change in said control clock signal from a first potential to a second potential, and reading out data at an address specified by the address signal from said memory means; and output means for outputting readout data of said readout means to outside after a first time period has elapsed from a change in said control clock signal from the second potential to the first potential, and stopping output of said readout data to outside after a second time period has elapsed from a change in said control clock signal from the first potential to the second potential.

2. The semiconductor memory device according to claim 1, wherein said second time period is equal to said first time period; and said output means includes, a delay circuit for delaying said control clock signal for said first time period, and an output buffer for outputting readout data of said readout means to outside in response to a change in an output signal of said delay circuit from the second potential to the first potential, and stopping output of said readout data to outside in response to a change in the output signal of said delay circuit from the first potential to the second potential.

3. The semiconductor memory device according to claim 1, wherein said second time period is shorter than said first time period; and said output means includes, a first delay circuit for delaying said control clock signal for said first time period, a second delay circuit for delaying said control clock signal for said second time period, a logic circuit for outputting the first potential in response to both output signals of said first and second delay circuits being the first potential, and an output buffer for outputting readout data of said readout means to outside in response to a change in an output signal of said logic circuit from the second potential to the first potential, and stopping output of said readout data to outside in response to a change in the output signal of said logic circuit from the first potential to the second potential.

4. A semiconductor memory device for reading out data in response to first and second control clock signals complementary to each other and an address signal which are applied externally, comprising:

first and second memory means, each including a plurality of addresses, and data being stored at each of said address;

first readout means for taking in said address signal in response to a change in said first control clock signal from a first potential to a second potential, and reading out data at an address specified by the address signal from said first memory means;

second readout means for taking in said address signal in response to a change in said second control clock signal from the first potential to the second potential, and reading out data at an address specified by the address signal from said second memory means;

first output means for outputting readout data of said first readout means to outside after a first time period has elapsed from a change in said first control clock signal from the second potential to the first potential, and stopping output of the readout data of said first readout means to outside after a second time period has elapsed from a change in said first control clock signal from the first potential to the second potential; and second output means for outputting readout data of said second readout means to outside after the first time period has elapsed from a change in said second control clock signal from the second potential to the first potential, and stopping output of the readout data of said second readout means to outside after the second time period has elapsed from a change in said second control clock signal from the first potential to the second potential.

5. The semiconductor memory device according to claim 4, wherein said second time period is equal to said first time period;

said first output means includes, a first delay circuit for delaying said first control clock signal for said first time period, and a first output buffer for outputting readout data of said first readout means in response to a change in an output signal of said first delay circuit from the second potential to the first potential, and stopping output of said readout data to outside in response to a change in the output signal of said first delay circuit from the first potential to the second potential; and said second output means includes, a second delay circuit for delaying said second control clock signal for said first time period, and a second output buffer for outputting readout data of said second readout means in response to a change in an output signal of said delay circuit from the second potential to the first potential, and stopping output of said readout data to outside in response to a change in the output signal of said second delay circuit from the first potential to the second potential.

6. The semiconductor memory device according to claim 4, wherein said second time period is shorter than said first time period;

said first output means includes, a first delay circuit for delaying said first control clock signal for said first time period, a second delay circuit for delaying said first control clock signal for said second time period, a first logic circuit for outputting the first potential in response to both output signals of said first and second delay circuits being the first potential, and a first output buffer for outputting readout data of said first readout means to outside in response to a change in an output signal of said first logic circuit from the second potential to the first potential, and stopping output of the readout data of said first readout means to outside in response to a change in the output signal of said first logic circuit from the first potential to the second potential; and said second output means includes, a third delay circuit for delaying said second control clock signal for said first time period, a fourth delay circuit for delaying said second control clock signal for said second time period, a second logic circuit for outputting the first potential in response to both output signals of said third and fourth delay circuits being the first potential, and a second output buffer for outputting readout data of said second readout means in response to a change in an output signal of said second logic signal from the second potential to the first potential, and stopping output of the readout data of said second readout means in response to a change in the output signal of said second logic circuit from the first potential to the second potential.

\* \* \* \* \*